United States Patent
Gao

(10) Patent No.: US 10,667,427 B2
(45) Date of Patent: May 26, 2020

(54) IMMERSION COOLING SYSTEM FOR DATA CENTERS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 12 days.

(21) Appl. No.: 16/028,356

(22) Filed: Jul. 5, 2018

(65) Prior Publication Data

US 2020/0015383 A1    Jan. 9, 2020

(51) Int. Cl.
   *H05K 7/20*    (2006.01)

(52) U.S. Cl.
   CPC ..... *H05K 7/20236* (2013.01); *H05K 7/20763* (2013.01)

(58) Field of Classification Search
   CPC ................... H05K 7/20236; H05K 7/20763
   See application file for complete search history.

(56) References Cited

U.S. PATENT DOCUMENTS

| | | | |
|---|---|---|---|
| 2013/0094146 A1* | 4/2013 | Tufty | G06F 1/20 361/699 |
| 2018/0098464 A1* | 4/2018 | Ishinabe | H05K 7/20236 |
| 2018/0135880 A1* | 5/2018 | Ghadiri Moghaddam | F24F 13/30 |
| 2019/0008077 A1* | 1/2019 | Ishinabe | H05K 7/20781 |

* cited by examiner

*Primary Examiner* — James Wu
*Assistant Examiner* — Hung Q Dang
(74) *Attorney, Agent, or Firm* — Womble Bond Dickinson (US) LLP

(57) ABSTRACT

Embodiments of the invention provide a system design for immersion cooling. The design utilizes a single cooling loop design. An external cooling unit, such as an indirect evaporative cooling (IDEC) system, is utilized to transfer the heat to the atmosphere from the cooling loop. The fluid in the cooling loop is driven by a centralized pump or pumps and the local pumps. The fluid is supplied to the immersion cooling rack or device. The design introduces several innovations on the cooling loop infrastructure by adding heat recovery system. Under different operating conditions, both the heat recovery system and external cooing unit can be connected into or bypassed from the main immersion cooling loop. At least some of the advantages include simplified infrastructure, a total system solution, high reliability, fast deployment, feasible system operation adjustment, cost reduction, and high operating efficiency.

17 Claims, 5 Drawing Sheets

IMMERSION COOLING SYSTEM FOR DATA CENTERS

FIELD OF THE INVENTION

Embodiments of the present invention relate generally to data centers. More particularly, embodiments of the invention relate to immersion cooling for data centers.

BACKGROUND

Heat removal is a prominent factor in a computer system and data center design. The number of high performance electronics components such as high performance processors packaged inside servers have steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient heat removal solutions especially in the cases of cooling these high performance servers.

Immersion cooling technology has brought many attentions recently. Many efforts are focusing on the fluid selection, information technology (IT) side design, material compatibilities, test and verification, and so on. Most of the solutions utilize existing cooling infrastructure (cooling water/chilled water) or system. In some of the solutions, a coolant distribution unit (CDU) is used to form an external cooling loop and an internal immersion cooling fluid loop. The external cooling loop can be adapted to any type of existing data center cooling infrastructures. These solutions may not fully utilize the advantages of immersion cooling.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
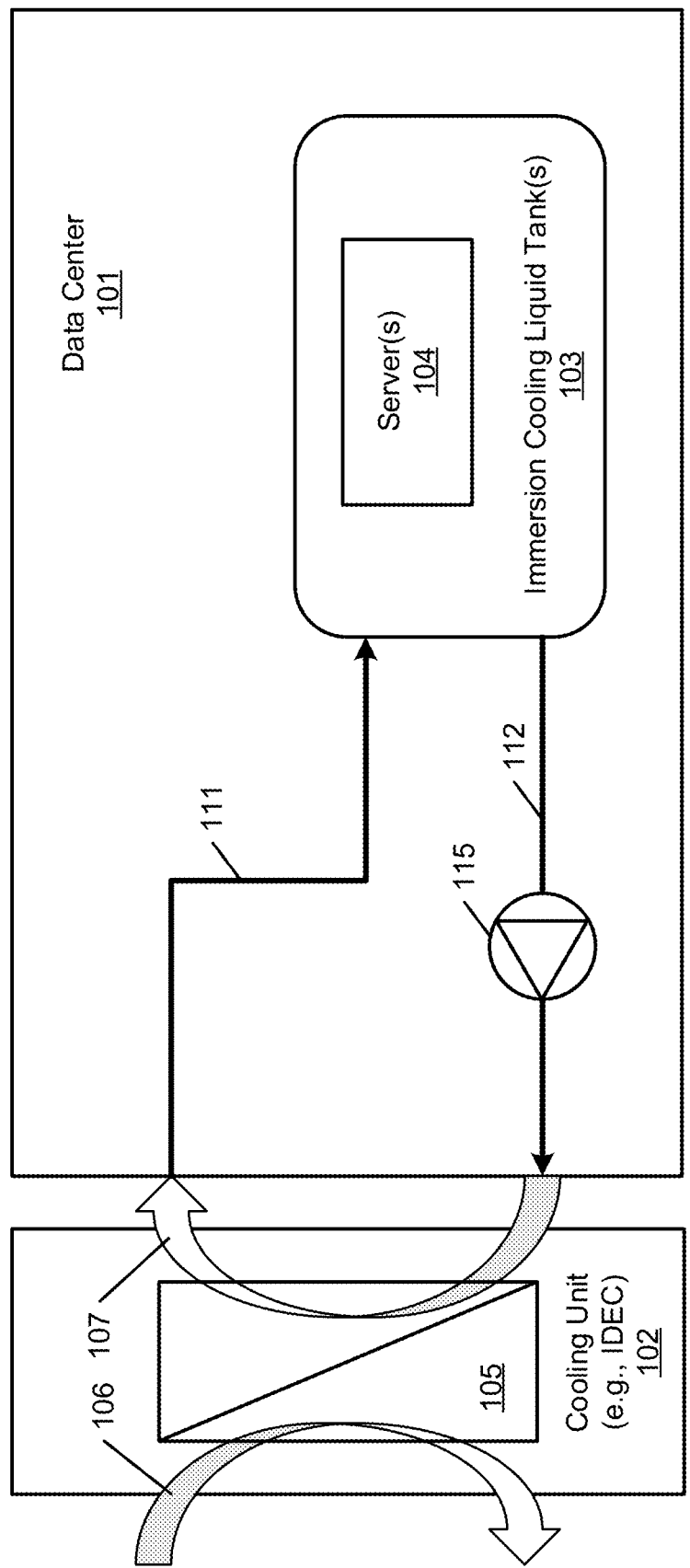
FIG. 1 is a block diagram illustrating an example of a data center system with immersion cooling according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the invention propose a total system design/solution for IT and data center immersion cooling. The Embodiments cover the entire cooling infrastructure design from ambient to IT. Immersion cooling is totally different from traditional air cooling solutions. Therefore, the infrastructure should be innovated to match its corresponding thermal and mechanical characteristics. In addition, the cooling infrastructure should be in high efficient, high reliability, fast deployable, easy control and maintenance and so on. Since most or all the heat is extracted to the immersion cooling fluid loop, there is a more opportunity for heat recovery.

Embodiments of the invention provide a system design for immersion cooling. The design utilizes a single cooling loop design. An external cooling unit, such as an indirect evaporative cooling (IDEC) system, is utilized to transfer the heat to the atmosphere from the cooling loop. The fluid in the cooling loop is driven by a centralized pump or pumps and the local pumps. The fluid is supplied to the immersion cooling rack or device. The design introduces several innovations on the cooling loop infrastructure by adding a heat recovery system. Under different operating conditions, both the heat recovery system and external cooing unit can be connected into or bypassed from the main immersion cooling loop. At least some of the advantages include simplified infrastructure, a total system solution, high reliability, fast deployment, feasible system operation adjustment, cost reduction, and high operating efficiency.

According to one aspect of the invention, the infrastructure includes an external cooling unit for exchanging the heat from a data center room and/or a data enter building to the atmosphere. The external cooling unit is located outside of the data center building. An immersion cooling loop is connecting the external cooling unit to one or more internal immersion racks. The heat generated within an immersion tank is extracted to immersion cooling fluid and the fluid is then pumped back to the external cooling unit. There is only one heat transfer loop between the external cooling unit and the immersion tank.

According to one embodiment, a data center immersion cooling system includes a cooling unit and an immersion tank filled with internal cooling liquid. The cooling system includes a heat exchanger. The heat exchanger includes a primary loop for circulating a first heat exchange material (e.g., cooling liquid or cool air) and a secondary loop for circulating the internal cooling liquid. The immersion tank contains one or more server blades submerged in the internal cooling liquid. Each server blade includes one or more IT components (e.g., processors, memory, storage devices). The internal cooling liquid is a thermally conductive dielectric liquid to extract the heat generated from the server blades. The data center immersion cooling system further includes a pair of a liquid supply line and a liquid return line coupled between the cooling unit and the immersion tank to form the secondary loop, without using a CDU between the external cooling unit and the immersion tank. The liquid supply line is configured to receive the cooling liquid from the cooling unit and to distribute the cooling liquid to the immersion tank. The liquid return line is to receive the cooling liquid carrying the exchanged heat from the immersion tank and to return the cooling liquid back to the heat exchanger.

In one embodiment, a liquid pump may be disposed on the liquid supply line and/or liquid return line. The data center immersion cooling system may further include a heat recovery unit coupled to the liquid return line between the heat exchanger of the cooling unit and the immersion tank. The heat recovery unit is configured to extract and recover the heat from the cooling liquid flowing within the liquid return line for other heating purposes. The heat recovery unit includes a unit such as a heat exchanger using a second heat exchange material to exchange the heat from the immersion cooling liquid flowing within the liquid return line.

In one embodiment, the data center immersion cooling system further includes a flow control device (FCD) disposed on the liquid return line between the heat recovery unit and the cooling unit. The FCD, when activated, is configured to divert or reroute at least a portion of the cooling liquid from the liquid return line back to the liquid supply line without going through the heat exchanger of the cooling unit. In another embodiment, another FCD is disposed on the liquid supply line, which when activated, is configured to divert or reroute at least a portion of the immersion cooling liquid from the liquid return line to the heat recovery unit.

According to another aspect of the invention, a cooling system design further includes a heat recovery system. Since the immersion cooling system extracted the IT heat load to the fluid, the heat recovery system is designed at the return side of the immersion cooling loop. Before the hot fluid returning back to the external cooling unit, it goes through a heat reuse unit first. The heat reuse unit is interchangeably with a heat recovery system in this application. The hot fluid can be used as a heating source for office building water system or office building air system as examples. For the immersion cooling loop, the heat recovery unit can be considered as an external cooling source. Therefore, if the external cooling source is sufficient, which means all the heat is recovered, and then the immersion loop fluid supplied from the heat reuse unit can return back to the immersion cooling loop supply directly, bypassing the external cooling source. When the system does not satisfy the heat recovery system requirement or the system recovery system is being serviced, or any other scenarios that the immersion cooling fluid does not need to pass through the heat reuse unit, a bypass loop can be used in the design, bypassing the heat recovery system.

According to one embodiment, a data center immersion cooling system includes a cooling unit having a heat exchanger and a data center containing one or more data center rooms. The heat exchanger includes a primary loop for circulating a first cooling material and a secondary loop for circulating internal cooling liquid for heat exchange. The internal cooling liquid is thermally conductive dielectric liquid. The data center room further includes a room liquid supply line and a room liquid return line. The room liquid supply line is to receive the cooling liquid from the cooling unit and to distribute the internal cooling liquid to the immersion tanks. The room liquid return line is to receive the internal cooling liquid carrying the heat exchanged from the immersion tanks and to return the cooling liquid back to the cooling unit. Each room is coupled to the room liquid supply line and the room liquid return line.

Each data center unit includes one or more immersion tanks and one or more local liquid pumps corresponding to the immersion tanks. Each of the immersion tanks contains one or more server blades submerged in the internal cooling liquid filled with in the immersion tank. Each server blade includes one or more IT components (e.g., processors, memory, storage devices). A local pump associated with an immersion tank is configured to pump the cooling liquid from the immersion tank and to transmit the cooling liquid back to the room liquid return line. The data center room further includes a heat reuse unit (also referred to as a heat recovery unit or system) coupled to the room liquid return line to extract heat from the cooling liquid flowing within the room liquid return line to reuse the extracted heat for other purposes (e.g., heat recycle usage).

In one embodiment, each data center unit further comprises a unit supply manifold (also referred to as a unit liquid supply line) and a unit return manifold (also referred to as a unit liquid return line) coupled to each of the immersion tanks. The unit supply manifold is coupled to the room supply line to receive the cooling liquid and to distribute the cooling liquid to the immersion tanks. The unit return manifold is to receive the cooling liquid carrying the heat exchanged from the immersion tanks and to transmit the cooling liquid back to the room liquid return line. In one embodiment, each of the local pumps is disposed between a corresponding immersion tank and the unit return manifold.

In one embodiment, the data center room further includes a first flow control device (FCD) disposed on the room liquid return line. The first FCD, when activated, is configured to divert or reroute at least a portion of the cooling liquid from the liquid return line to the heat reuse unit. In another embodiment, the data center room further includes a second FCD device coupled between the heat reuse unit and the room liquid supply line. The second FCD, when activated, is configured to divert or reroute at least a portion of the cooling liquid received from the heat reuse unit to the room liquid supply line, bypassing the heat exchanger of the external cooling unit.

FIG. 1 is a block diagram illustrating a data center system according to one embodiment. Referring to FIG. 1, data center immersion cooling cooling system 100 is referred to as a data center system with immersion cooling. In one embodiment, data center immersion cooling system 100 includes data center or data center unit 101 coupled to external cooling unit 102. External cooling unit 102 may be an indirect evaporative cooling (IDEC) unit. Cooling unit 102 includes a heat exchanger 105, which may be a liquid-to-liquid heat exchanger or an air-to-liquid heat exchanger. Typically, heat exchanger 105 includes a primary loop 106 and a secondary loop 107. Primary loop 106 is utilized to circulate external cooling material such as external air or external liquid. Secondary loop 107 is utilized to circulate internal cooling liquid to exchange heat with the external cooling material of primary loop 106.

In one embodiment, data center 101 includes an immersion tank 103 filled with the internal cooling liquid, i.e., immersion cooling liquid. Although there is one immersion tank shown herein, more immersion tanks can also be included within data center 101. Immersion tank 103 contains one or more server blades 104 and each server blade includes one or more IT components (e.g., processors, memory, storage devices). Server blades 104 are submerged in the internal cooling liquid. The internal cooling liquid is thermally conductive dielectric liquid designed to extract the heat from the server blades. Such cooling technique is referred to as immersion cooling.

Server immersion cooling is a computer cooling practice by which computer components or servers are submerged in a thermally conductive dielectric liquid. Common dielectrics which are suitable for immersion cooling are typically oil-based. Server immersion cooling has the potential of becoming a popular server cooling solution for green data centers, as it allows them to drastically reduce their energy load, regardless of their PUE. Servers and other IT hardware cooled by immersion cooling do not require fans, thus these are removed.

Referring back to FIG. 1, according to one embodiment, data center 101 includes a liquid supply line 111 and a liquid return line 112 coupled to the secondary side of the heat exchanger 105 of cooling system 102 to form the secondary loop. In addition, liquid supply line 111 is coupled to an intake port of immersion tank 103 and liquid return line 112 is coupled to an outlet port of immersion tank 103. Liquid supply line 111 is configured to receive the cooling liquid from heat exchanger 105 and to distribute the cooling liquid to immersion tank 103. Liquid return line 112 is configured to receive the cooling liquid carrying the heat exchanged from server blades 104 from immersion tank 103 and to return the cooling liquid back to heat exchanger 105 for heat exchange.

In addition, a liquid pump 115 may be disposed on liquid return line 112 to pump and circulate the cooling liquid to flow within the secondary loop. In addition, multiple pumps may be designed in the system (on main supply line 111 or on main return line 112 for redundant purpose. Note that if there are multiple immersion tanks within data center 101, there will be multiple pairs of liquid supply line and liquid return line to couple the immersion tanks with heat exchanger 105 of cooling system 102. Unlike conventional cooling systems, the secondary loop 107 via liquid supply line 111, immersion tank 103, and liquid return line 112 is a single heat transfer loop without using a CDU in between. Typically, a CDU also includes a heat exchanger having a primary loop and a secondary loop therein, which will form multiple loops between cooling system 102 and immersion tank 103. Also note that liquid pump 115 may be disposed on liquid supply line 111 or alternatively, there may be multiple liquid pumps, one disposed on liquid supply line 111 and another one disposed on liquid return line 112.

Figure 2:
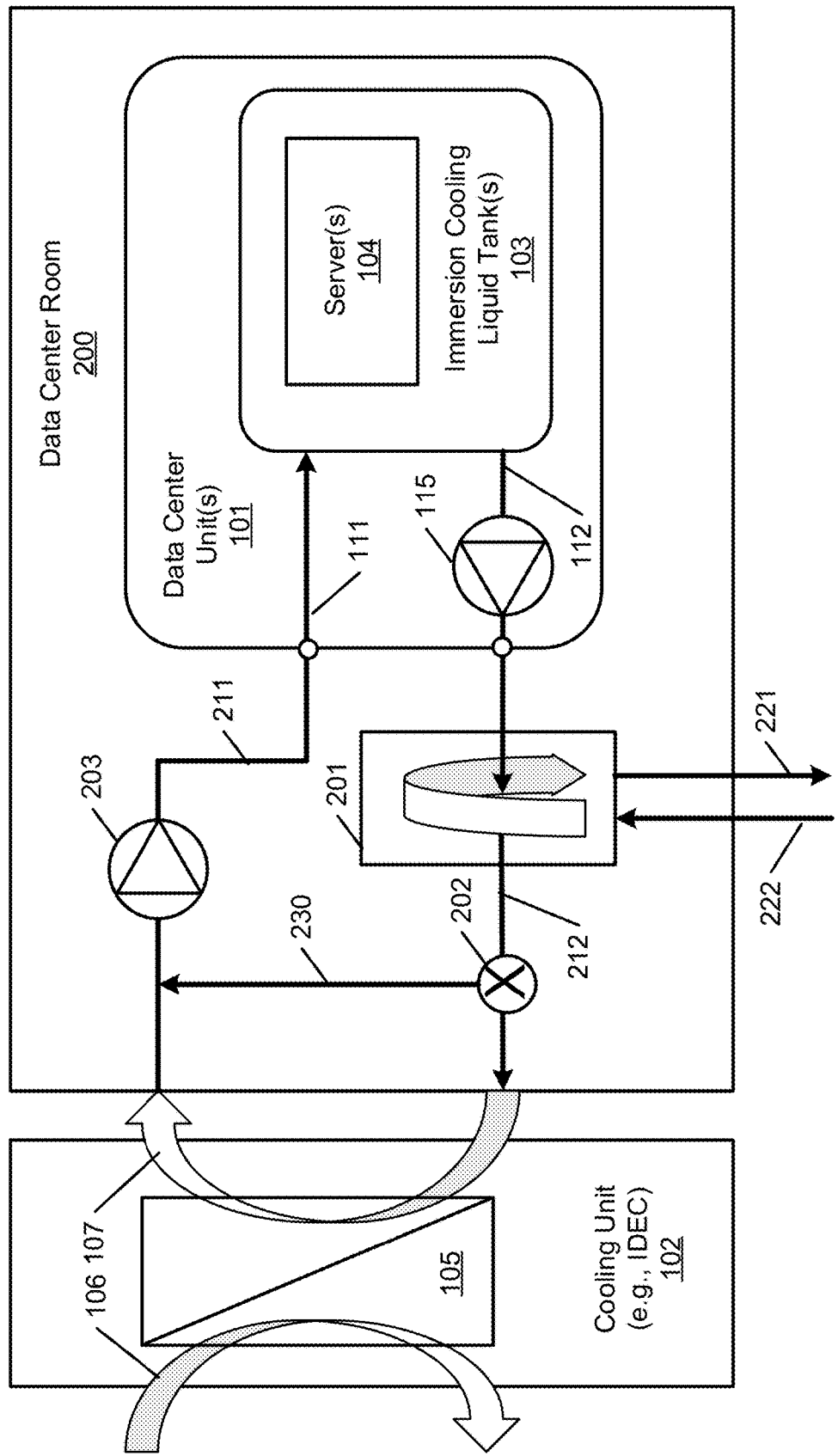
FIG. 2 is a block diagram illustrating an example of a data center system with immersion cooling according to another embodiment.

FIG. 2 is a block diagram illustrating an example of a data center system according to another embodiment. Referring to FIG. 2, the data center includes a data center room 200 containing one or more data center units such as data center unit 101. Data center room 200 includes a room liquid supply line 211 coupled to one end of secondary loop 107 of heat exchanger 105 and a room liquid return line 212 coupled to the other end of secondary loop 107 of heat exchanger 105. Room liquid supply line 211 is coupled to a unit liquid supply line of each of the data center units, such as unit liquid supply line 111 of data center unit 101. Room liquid return line 212 is coupled to a unit liquid return line of each of the data center units, such as unit liquid return line 112 of data center unit 101.

According to one embodiment, heat reuse unit (also referred to as a heat recovery unit) 201 is coupled to room liquid return line 212. Heat reuse unit 201 includes a device therein similar to a heat exchanger to exchange the heat flowing through room liquid return line 212 (e.g., primary loop) using second external heat exchange material, for example, in a form of air or liquid, through a pair of heat reuse supply line 221 and heat reuse return line 222 (e.g., secondary loop or heat exchange channel). The heat extracted from room liquid return line 212 can be utilized for other purposes, such as, for example, heating water of a building or warming up the airspace of a room, etc. The cooling liquid carrying the heat exchanged from immersion tank 101 flows through the heat reuse unit 201 first and then returns to heat exchanger 105 of cooling unit 102.

In one embodiment, one or more liquid pumps, such as liquid pump 203, may be disposed on room liquid supply line 211 and/or room liquid return line 212. Liquid pump 203 is configured to pump the cooling liquid from heat exchanger 105 to data center unit 101. According to another embodiment, a flow control device (FCD) 202 is disposed on room liquid return line 212, between heat exchanger 105 and heat reuse unit 201. When FCD 202 is activated, FCD 202 is configured to divert or reroute at least a portion of the cooling liquid from room liquid return line 212 to room liquid supply line 211 via bypass path 230.

FCD 202 may be a three-way valve that can be configured in a first switching position and a second switching position. FCD can be also a two-way valve installing on line 230. When FCD 202 is configured in a first switching position, the cooling liquid is allowed to flow through room liquid return line 212 to reach heat exchanger 105 from immersion tank 101. When FCD 202 is configured in a second switching position, the bypass path 230 is opened or turned on and the cooling liquid flows through bypass path 230 to reach room liquid supply line 211, bypassing heat exchanger 105. In one embodiment, a temperature sensor may be disposed on room liquid return line 212 (not shown), for example, between FCD 202 and heat reuse unit 201, to sense and monitor the temperature of the cooling liquid flowing within room liquid return line 212 or 230. When the temperature of the cooling liquid drops below a predetermined threshold, FCD 202 and bypass path 230 are activated. The rationale behind is that when the temperature of the cooling liquid is low, there is no need to send the cooling liquid to heat exchanger 105 for heat exchange. The cooling liquid can be directly recirculated back to room liquid supply line 211.

Figure 3:
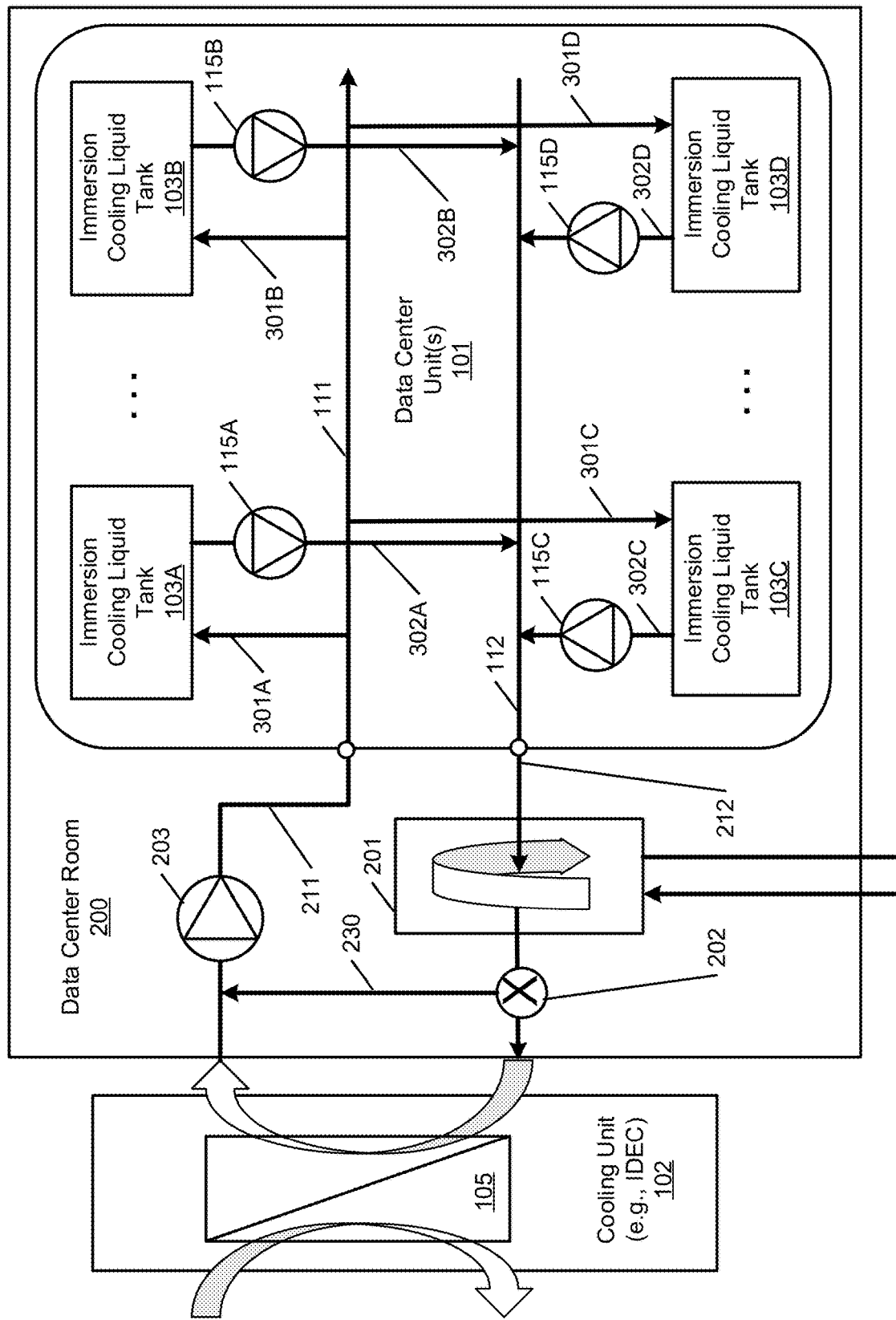
FIG. 3 is a block diagram illustrating an example of a data center system with immersion cooling according to another embodiment.

Note that each data center unit may contain multiple immersion tanks as shown in FIG. 3. Referring now to FIG. 3, in this example, data center unit 101 includes multiple immersion tanks 103A-103D (collectively referred to as immersion tanks 103) coupled to a unit supply manifold 111 (also referred to as a unit liquid supply line) and a unit return manifold 112 (also referred to as a unit liquid return line). Unit liquid supply manifold 111 is configured to receive cooling liquid from room liquid supply line 211 and to distribute the cooling liquid to immersion tanks 103. Unit liquid return manifold 112 is configured to receive the cooling liquid carrying the heat exchanged from the immersion tanks 103 back to room liquid return line 212.

For each of the immersion tanks 103, a tank liquid supply line (e.g., liquid supply lines 301A-301D, collectively referred to as tank liquid supply lines 301) is coupled to unit liquid supply manifold 111 to deliver the cooling liquid to the corresponding immersion tank. Similarly, a tank liquid return line (e.g., liquid return lines 302A-302D, collectively referred to as liquid return lines 302) is coupled to unit return manifold 212 to receive and return the cooling liquid from the corresponding immersion tank back to unit liquid return manifold 112. In addition, a local pump such as pumps 115A-115D may be utilized to pump the cooling liquid from immersion tanks 103 to unit liquid return manifold 112. Alternatively, there may be a local pump disposed on unit liquid supply manifold 111 and/or unit liquid return manifold 112.

Figure 4:
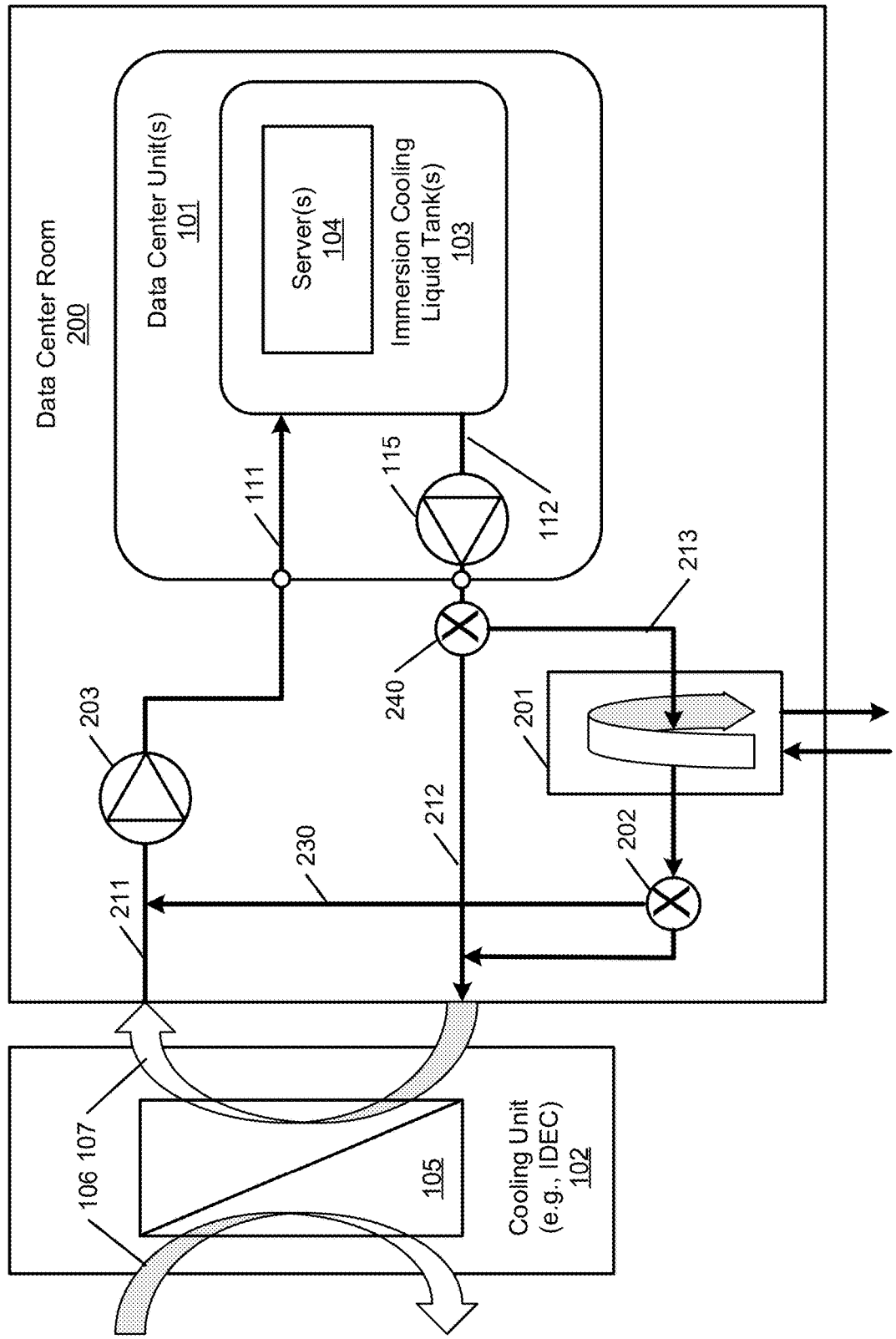
FIG. 4 is a block diagram illustrating an example of a data center system with immersion cooling according to another embodiment.
Figure 5:
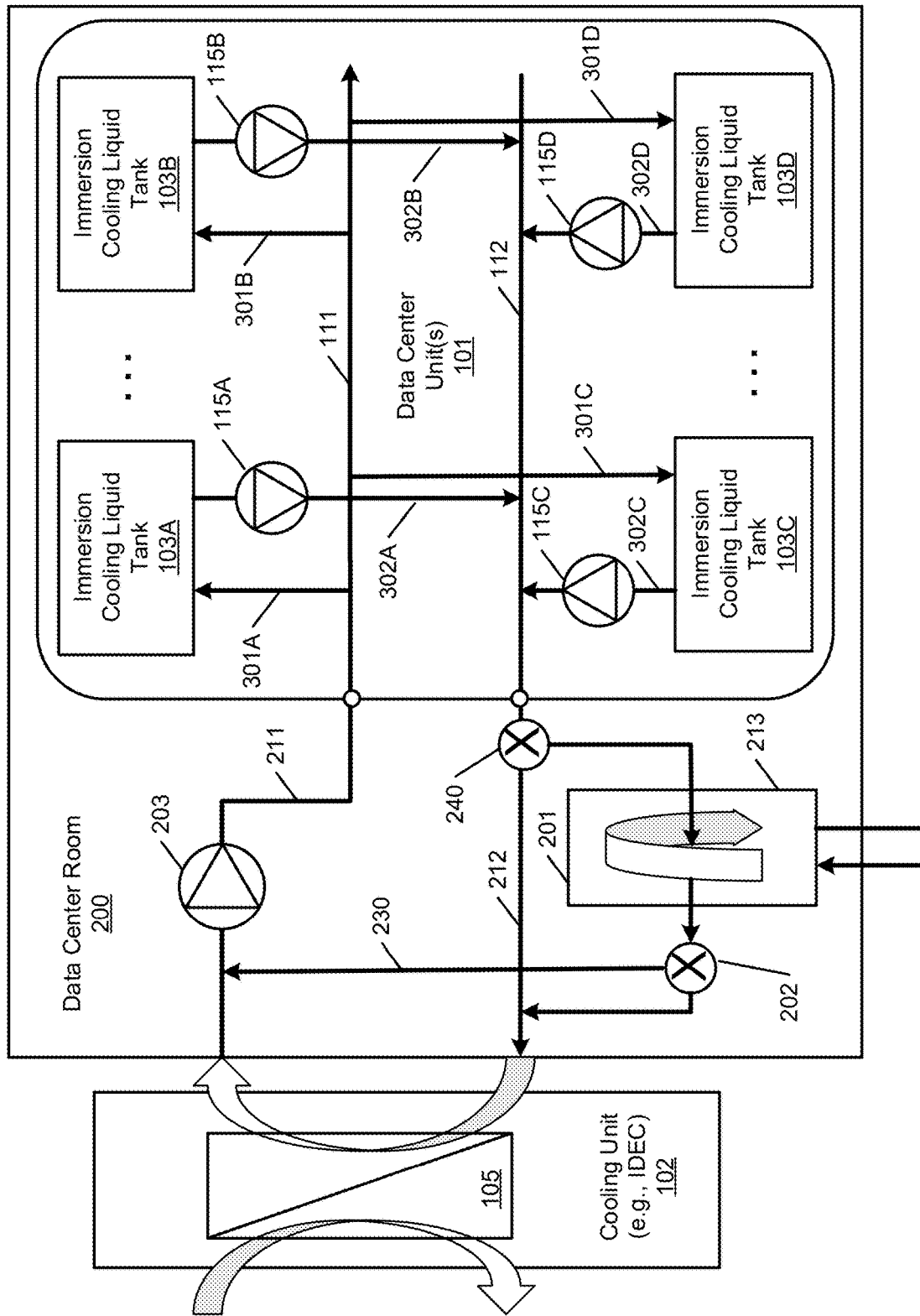
FIG. 5 is a block diagram illustrating an example of a data center system with immersion cooling according to another embodiment.

FIG. 4 is a block diagram illustrating a data center immersion cooling system according to another embodiment. Referring to FIG. 4, in this embodiment, an additional FCD 240 is disposed on room liquid return line 212 to divert or reroute at least a portion of the cooling liquid to heat reuse unit 201 via path 213. As a result, the liquid flow can be controlled to flow via path 212, via path 213, or both. That is, when the heat reuse system 201 does not satisfy the heat recovery system requirement or the system recovery system is being serviced, or any other scenarios that the immersion cooling fluid does not need to pass through the heat reuse unit 201, heat reuse unit 201 can be deactivated by shutting off path 213 via FCD 240. For example, if the liquid temperature at the output of the heat reuse unit 201 (between FCD 202 and heat reuse unit 201) is higher than a predetermined threshold, that means the heat has not be recovered or reused successfully. As a result, there is no need to activate heat reuse unit 201, and the cooling liquid flow should flow through path 212 to heat exchanger 105 without going through heat reuse unit 201. Similar to the configuration as shown in FIG. 3, each data center unit can contain multiple immersion tanks as shown in FIG. 5.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A data center immersion cooling system, comprising:
    a cooling unit having a heat exchanger, the heat exchanger including a primary loop for circulating a first heat exchange material and a secondary loop for circulating internal cooling liquid to exchange heat;
    an immersion tank filled with the internal cooling liquid, the immersion tank to contain one or more server blades submerged in the internal cooling liquid, wherein the internal cooling liquid is a thermally conductive dielectric liquid to extract heat generated from the server blades;
    a liquid supply line and a liquid return line coupled between the cooling unit and the immersion tank to circulate the internal cooling liquid between the immersion tank to form the secondary loop, without using a coolant distribution unit (CDU) between the cooling unit and the immersion tank, wherein the liquid supply line is to receive the cooling liquid from the heat exchanger and to supply the cooling liquid to the immersion tank, and wherein the liquid return line is to receive the cooling liquid carrying exchanged heat from the immersion tank and to return the cooling liquid back to the heat exchanger;
    a heat recovery unit disposed on the liquid return line between the heat exchanger of the cooling unit and the immersion tank, wherein the heat recovery unit is configured to recover the heat exchanged from the immersion tank and to distribute the heat for other heating purposes; and
    a first flow control device (FCD) disposed on the liquid return line between the heat recovery unit and the cooling unit, wherein the first FCD, when activated, is configured to divert at least a portion of the cooling liquid from the heat recovery unit to the liquid supply line without going through the heat exchanger of the cooling unit.

2. The data center immersion cooling system of claim 1, further comprising a liquid pump disposed on the liquid supply line to pump the cooling liquid from the heat exchanger and to supply the cooling liquid to the immersion tank.

3. The data center immersion cooling system of claim 1, further comprising a liquid pump disposed on the liquid return line to pump the cooling liquid out from the immersion tank and to return the cooling liquid to the heat exchanger.

4. The data center immersion cooling system of claim 1, wherein the heat recovery unit comprises a heat exchange channel to extract and exchange, using a second heat exchange material, at least a portion of heat carried by the cooling liquid flowing within the liquid return line.

5. The data center immersion cooling system of claim 4, wherein the heat extracted from the liquid return line can be utilized to warm water or air in a building.

6. The data center immersion cooling system of claim 1, wherein the first FCD is activated when a temperature of the cooling liquid that has gone through the heat recovery unit is below a predetermined threshold.

7. The data center immersion cooling system of claim 3, further comprising a second liquid pump disposed on the liquid supply line to pump and supply the cooling liquid to the immersion tank.

8. The data center immersion cooling system of claim 1, further comprising a second FCD disposed on the liquid return line, wherein the second FCD, when activated, is configured to divert at least a portion of the cooling liquid from the liquid return line to the heat recovery unit.

9. The data center immersion cooling system of claim 1, wherein the immersion tank is one of a plurality of immersion tanks, each of the immersion tanks being coupled to the heat exchanger of the cooling unit via a corresponding liquid supply line and a corresponding liquid return line.

10. The data center immersion cooling system of claim 9, further comprising a plurality of local liquid pumps, each disposed on a liquid return line of one of the immersion tanks to pump and extract the cooling liquid from the immersion tank back to the heat exchanger of the cooling unit.

11. The data center immersion cooling system of claim 1, wherein the heat exchanger is an air-to-liquid (air/liquid) heat exchanger or a liquid-to-liquid (liquid/liquid) heat exchanger.

12. A data center immersion cooling system, comprising:
    a cooling unit having a heat exchanger, the heat exchanger including a primary loop for circulating a first heat exchange material and a secondary loop for circulating internal cooling liquid to exchange heat; and
    a data center room, including
        a room liquid supply line to receive the internal cooling liquid from the heat exchanger,
        a room liquid return line to return the internal cooling liquid carrying exchanged heat back to the heat exchanger, and
        a plurality of data center units coupled to the room liquid supply line and the room liquid return line, wherein each data center unit comprises
            one or more immersion tanks, each of the immersion tanks to contain one or more server blades submerged in the internal cooling liquid,
            one or more local liquid pumps to pump the cooling liquid from the immersion tanks to the room liquid return line, and a heat reuse unit coupled to the room liquid return line to extract heat from the cooling liquid flowing within the room liquid return line to reuse the heat for other purposes, and a first flow control device (FCD) coupled between the heat reuse unit and the room liquid supply line, wherein the first FCD, when activated, is configured to divert at least a portion of the cooling liquid received from the heat reuse unit to the room liquid supply line, bypassing the heat exchanger of the cooling unit.

13. The data center immersion cooling system of claim 12, wherein the data center room further comprises a room liquid pump disposed on a room liquid supply line to pump the cooling liquid to be supplied to the data center units.

14. The data center immersion cooling system of claim 13, wherein each of the data center unit further comprises:

a unit supply manifold coupled to the room liquid supply line to receive and supply the cooling liquid to the immersion tanks; and a unit return manifold coupled to the room liquid return line to receive and return the cooling liquid from the immersion tanks.

15. The data center immersion cooling system of claim 14, wherein each of the local pumps is coupled between a corresponding immersion tank and the unit return manifold.

16. The data center immersion cooling system of claim 13, wherein the data center room further comprises a second FCD disposed on the room liquid return line, wherein the second FCD, when activated, is configured to divert at least a portion of the cooling liquid from the liquid return line to the heat reuse unit.

17. The data center immersion cooling system of claim 12, wherein the first FCD is activated when a temperature of the cooling liquid output from the heat reuse unit is below a predetermined threshold.

* * * * *